United States Patent
Miyauchi et al.

(10) Patent No.: US 7,580,231 B2
(45) Date of Patent: Aug. 25, 2009

(54) MAGNETO-RESISTIVE ELEMENT HAVING A FREE LAYER PROVIDED WITH A TERNARY ALLOY LAYER

(75) Inventors: Daisuke Miyauchi, Tokyo (JP); Tomohito Mizuno, Tokyo (JP)

(73) Assignee: TDK Corporation, Tokyo (JP)

( * ) Notice: Subject to any disclaimer, the term of this patent is extended or adjusted under 35 U.S.C. 154(b) by 460 days.

(21) Appl. No.: 11/588,376

(22) Filed: Oct. 27, 2006

(65) Prior Publication Data

US 2007/0097561 A1 May 3, 2007

(30) Foreign Application Priority Data

Oct. 28, 2005 (JP) .............................. 2005-314573
Sep. 6, 2006 (JP) .............................. 2006-241402

(51) Int. Cl.
*G11B 5/39* (2006.01)
(52) U.S. Cl. .................................................. 360/324.12
(58) Field of Classification Search .............. 360/324.1, 360/324.11, 324.12, 324.2
See application file for complete search history.

(56) References Cited

U.S. PATENT DOCUMENTS

| | | | |
|---|---|---|---|
| 6,905,780 B2 | 6/2005 | Yuasa et al. | |
| 6,927,952 B2 | 8/2005 | Shimizu et al. | |
| 2005/0152077 A1* | 7/2005 | Yuasa et al. | 360/324.11 |
| 2005/0195534 A1* | 9/2005 | Gill | 360/324.12 |
| 2005/0243477 A1* | 11/2005 | Gill | 360/324.11 |
| 2005/0270702 A1* | 12/2005 | Komagaki et al. | 360/319 |
| 2007/0230067 A1* | 10/2007 | Jogo et al. | 360/324.1 |
| 2007/0268743 A1* | 11/2007 | Daughton et al. | 365/173 |

FOREIGN PATENT DOCUMENTS

| | | |
|---|---|---|
| JP | A-2001-298226 | 10/2001 |
| JP | A-2003-86861 | 3/2003 |
| JP | 2003-133614 A | 5/2003 |
| JP | 2003-152239 A | 5/2005 |

* cited by examiner

*Primary Examiner*—Jefferson Evans
(74) *Attorney, Agent, or Firm*—Oliff & Berridge, PLC

(57) ABSTRACT

A magneto-resistive element has a pinned layer, a free layer, and a spacer layer which is sandwiched between the pinned layer and the free layer. The spacer layer is made of copper. The magneto-resistive element is configured such that sense current is applied in a direction that is perpendicular to layer surfaces. The free layer has: a nonmagnetic layer that includes copper as a main component; and ternary alloy layers each including cobalt (Co), iron (Fe), and nickel (Ni), the ternary alloy layers being disposed on both sides of the nonmagnetic layer. The ternary alloy layer includes nickel and iron at a composition ratio in which a ratio x of an atomic percentage of nickel to a total atomic percentage of nickel and iron is $27\% \leqq x \leqq 45\%$.

10 Claims, 11 Drawing Sheets

Track Width Direction

Track Width Direction

MAGNETO-RESISTIVE ELEMENT HAVING A FREE LAYER PROVIDED WITH A TERNARY ALLOY LAYER

This Application is a U.S. Utility Patent Application which claims foreign priority from Japanese Application No. 2005-314573, filed Oct. 28, 2005, and from Japanese Application No. 2006-241402, filed Sep. 6, 2006, the complete disclosures of which are incorporated herein by reference.

BACKGROUND OF THE INVENTION

1. Field of the Invention

The present invention relates to a magneto-resistive element, particularly to a magneto-resistive element that is used in a thin-film magnetic head of a magnetic recorder, such as a hard disk drive.

2. Description of the Related Art

Magnetic heads that uses a GMR (Giant Magneto-resistive) element for reading magnetic data have been used in order to meet the need for higher magnetic recording densities. In particular, a GMR element using a spin valve (SV) film has the potential for providing a highly sensitive magnetic head, because it exhibits a large change in electric resistance for sense current, which is applied to the element in order to read data that are recorded in a recording medium. In this specification, SV film means an assembly of stacked layers that has a ferromagnetic layer whose magnetization direction is fixed in one direction (hereafter referred to as a pinned layer), a ferromagnetic layer whose magnetization direction is changed in accordance with an external magnetic field that is generated by a recording medium (hereafter referred to as a free layer), and a nonmagnetic intermediate layer that is sandwiched between the pinned layer and the free layer. In an SV film, the magnetization direction of the free layer makes a relative angle with magnetization direction of the pinned layer in accordance with an external magnetic field, and magnetic resistance is changed depending on the change in the spin-dependent scattering of conduction electrons that is caused in accordance with the relative angle. A magnetic head detects the change in magnetic resistance, and reads magnetic information in the recording medium.

A CIP (Current in Plane)-GMR element, in which sense current is applied in parallel with layer surfaces, has been conventionally used as a MR element that uses an SV film. However, a magnetic head using a CPP (Current Perpendicular to the Plane)-GMR element, in which sense current is applied in a direction that is perpendicular to layer surfaces, has been developed recently in order to meet the need for higher magnetic recording densities. A CPP-GMR element exhibits a smaller resistance than a TMR (Tunnel Magneto-resistance) element that uses a TMR film, which is another CPP type element. A CPP-GMR also exhibits a higher output than a CIP-GMR element even when magnetic information which is recorded in a narrow track width is read. Therefore, the CPP-GMR element is expected to be a promising element having high potential.

However, if an SV film having the same layer structure as used in a CIP-GMR element is applied to the CPP-GMR element without being modified, then it is difficult to obtain a sufficient change in magnetic resistance. This is mainly because the electric resistance in layers that contribute to the change in resistance (the free layer, the pinned layer, and the nonmagnetic intermediate layer) occupies a small percentage relative to the total resistance of the element. Specifically, in a CIP-GMR element, a sufficient amount of change in magnetic resistance is obtained due to spin-dependent scattering that is caused in an in-plane direction because electric current is applied in the direction that is parallel to the layer surfaces. However, in a CPP-GMR element, spin-dependent scattering is not sufficiently caused at the boundaries between layers because sense current is applied in the direction that is perpendicular to the layer surfaces. Further, in an ordinary GMR element, boundaries that contribute to spin-dependent scattering are limited to two, i.e., the boundary between the nonmagnetic intermediate layer and the free layer, and the boundary between the nonmagnetic intermediate layer and the pinned layer. Accordingly, boundaries do not contribute sufficiently to the change in magnetic resistance as a whole. On the other hand, a CPP-GMR element generally exhibits a larger amount of bulk scattering, which is scattering of conduction electrons within layers, than a CIP-GMR element, because sense current flows through each layer. Therefore, bulk scattering contributes more to the change in magnetic resistance in a CPP-GMR element. For this reason, in a CPP-GMR element, a useful effect can be obtained by increasing the thickness of the free layer and the pinned layer in order to achieve a large amount of change in magnetic resistance.

In Japanese Patent Laid-Open Publication No. 2003-152239, a technique is disclosed to increase the number of boundaries by inserting a nonmagnetic intermediate layer in the free layer or in the pinned layer, and thereby to enhance the magneto-resistance effect, instead of increasing the thickness of the free layer or the pinned layer. A free layer is proposed in this patent document in which a CoFeB alloy layer, a Cu nonmagnetic layer, and a CoFeB alloy layer are stacked (CoFeB/Cu/CoFeB layers). Since a large amount of spin polarization is caused at the boundaries between the CoFe base alloy layer and the Cu layer and, as a result, spin-dependent scattering is promoted, a large change in magnetic resistance is obtained.

In Japanese Patent Laid-Open Publication No. 2003-133614, a layer structure of a SV film is disclosed in which at least either the free layer or the pinned layer has a ternary alloy, which consists of nickel, iron, and cobalt, in order to obtain a large change of magnetic resistance.

As described above, in a CPP-GMR element, a large magneto-resistance ratio can be effectively obtained by increasing the thickness of the free layer and the pinned layer, and thereby enhancing the contribution of bulk scattering. However, an increase in the thickness of a SV film leads to an increase in the distance between shield layers. This is not preferable for obtaining a high linear recording density. Accordingly, it is desirable to obtain a large magneto-resistance ratio without increasing the thickness of the free layer because the thickness of the SV film is limited. In addition, the free layer needs to have proper magnetic properties that are required for a soft magnetic metal (referred to as soft magnetic properties), as well as a large magneto-resistance ratio, when it is used for the read element of a magnetic head. The soft magnetic properties mean low coercive force and low magneto-striction.

SUMMARY OF THE INVENTION

An object of the present invention is to provide a CPP-GMR element that has an SV film with a small thickness, and that is capable of exhibiting both a large magneto-resistance ratio and good soft magnetic properties that is required for a free layer. Another object of the present invention is to provide a hard disk drive etc. having the same.

A magneto-resistive element according to the present invention comprises; a pinned layer whose magnetization direction is fixed with respect to an external magnetic field, a free layer whose magnetization direction is changed in accordance with the external magnetic field, and a spacer layer which is sandwiched between the pinned layer and the free layer, the spacer layer being made of copper. The magneto-resistive element is configured such that sense current is applied in a direction that is perpendicular to layer surfaces. The free layer comprises: a nonmagnetic layer that includes copper as a main component; and ternary alloy layers each including cobalt (Co), iron (Fe), and nickel (Ni), the ternary alloy layers being disposed on both sides of the nonmagnetic layer. The ternary alloy layer includes nickel and iron at a composition ratio in which a ratio x of an atomic percentage of nickel to a total atomic percentage of nickel and iron is $27\% \leq x \leq 45\%$.

It is possible to minimize the deterioration of the soft magnetic properties (coercive force and magneto-striction) while enhancing the magneto-resistance ratio, when the ratio x of the atomic percentage of nickel is as low as $27\% \leq x \leq 45\%$. On the other hand, the soft magnetic properties can be improved because a CoFe layer is not provided, while the magneto-striction and the magneto-resistance ratio can be improved with the help of Co. As a result, it is possible to improve the magneto-resistance ratio and the coercive force, while keeping the magneto-striction at a practical level. Further, since a ternary alloy layer, which consists of cobalt, iron, and nickel, is substituted for a three-layer structure, which consists of a NiFe layer and CoFe layers that sandwich the NiFe layer therebetween, in a conventional free layer, the present invention also contributes to the reduction in the total film thickness of the magneto-resistive element.

The ratio y of an atomic percentage of cobalt to a total atomic percentage of nickel, iron, and cobalt is preferably in a range of $42\% \leq y \leq 76\%$, and more preferably in a range of $52\% \leq y \leq 65\%$.

The free layer may consist of one nonmagnetic layer and two ternary alloy layers which are provided on both sides of the nonmagnetic layer. In this arrangement, a thickness t of each ternary alloy layer is preferably in a range of $1.3$ nm $\leq t \leq 3.5$ nm.

The free layer may consist of two nonmagnetic layers and three ternary alloy layers which are provided on both sides of the nonmagnetic layers. In this arrangement, a thickness t of each ternary alloy layer is preferably in a range of $1.3$ nm $\leq t \leq 2.3$ nm, and more preferably in a range of $1.6$ nm $\leq t \leq 2.3$ nm.

A thin-film magnetic head according to the present invention has the magneto-resistive element mentioned above.

A wafer according to the present invention is used to manufacture the thin-film magnetic head. The wafer comprises the magneto-resistive element mentioned above.

A head gimbal assembly according to the present invention comprises: a slider that includes the thin-film magnetic head, the slider being configured to be arranged opposite to a recording medium; and a suspension for elastically supporting the slider.

A hard disk device according to the present invention comprises: a slider that includes the thin-film magnetic head, the slider being configured to be arranged opposite to a disc-shaped recording medium that is rotatably driven; and a positioning device for supporting the slider and for positioning the slider relative to the recording medium.

A magnetic memory device according to the present invention comprises: a plurality of magneto-resistive elements; a plurality of lines which are connected to the plurality of magneto-resistive elements, the lines being configured selectively to write information to one of the magneto-resistive elements, and selectively to read information from one of the magneto-resistive elements.

A magnetic sensor assembly according to the present invention comprises: a substrate which is provided with the magneto-resistive element; and a lead line which is connected to the magneto-resistive element and which outputs magnetic information of the external magnetic field, the magnetic information being detected by the magneto-resistive element.

As described above, according to the present invention, the reduction in the film thickness of an SV film can be achieved, as well as a large magneto-resistance ratio and good soft magnetic properties. Accordingly, a magneto-resistive element, as well as a hard disk drive using the same, is provided which is suitable for meeting the need for a higher linear recording densities in the future and which is excellent in reading performance.

The above and other objects, features, and advantages of the present invention will become apparent from the following description with reference to the accompanying drawings which illustrate examples of the present invention.

DETAILED DESCRIPTION OF THE INVENTION

Figure 1:
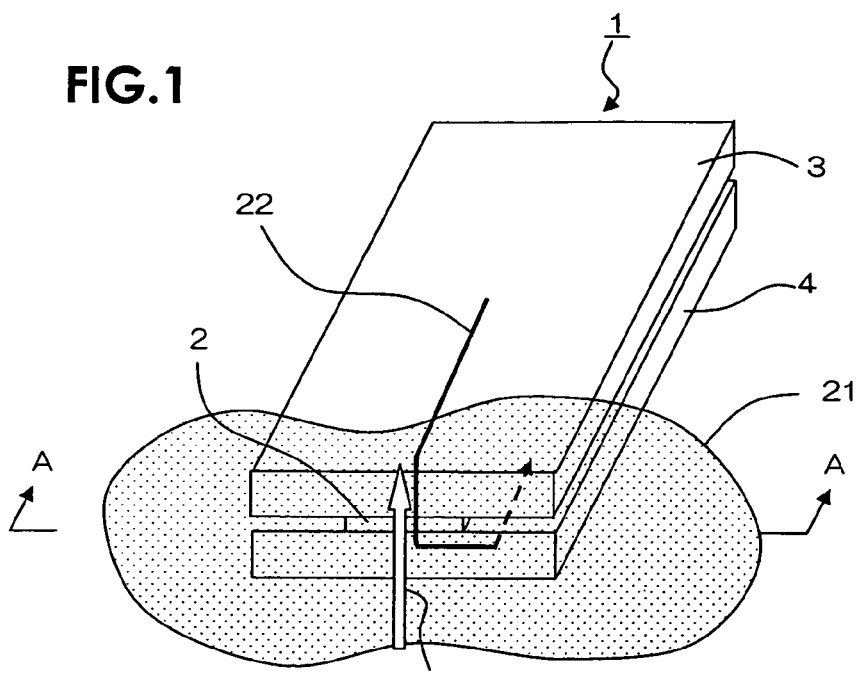
FIG. 1 is a partial perspective view of a thin-film magnetic head having a magneto-resistive element according to the present invention.

An embodiment of a magneto-resistive element (hereafter referred to as CPP element 2) according to the present invention will be described with reference to the drawings. FIG. 1 is a partial perspective view of a thin-film magnetic head that uses a magneto-resistive element according to the present embodiment. Thin-film magnetic head 1 may be a read only head, or may be a MR/inductive composite head that is further provided with a write head portion. CPP element 2 is sandwiched by upper electrode layer 3 and lower electrode layer 4, with the tip portion thereof arranged opposite to recording medium 21. In CPP element 2, sense current 22 flows from upper electrode layer 3 to lower electrode layer 4 through CPP element 2 in a direction perpendicular to the layer surfaces, as shown by the arrow in FIG. 1. Sense current 22 is generated by a voltage that is applied between upper electrode layer 3 and lower electrode layer 4. The magnetic field that is applied to CPP element 2 from recording medium 21 is changed in accordance with the movement of recording medium 21 that rotates in direction 23. CPP element 2 reads magnetic information that is recorded in each magnetic domain of recording medium 21 by detecting the change in magnetic field as the change in electric resistance of sense current 22 that is caused by the GMR effect.

Figure 2:
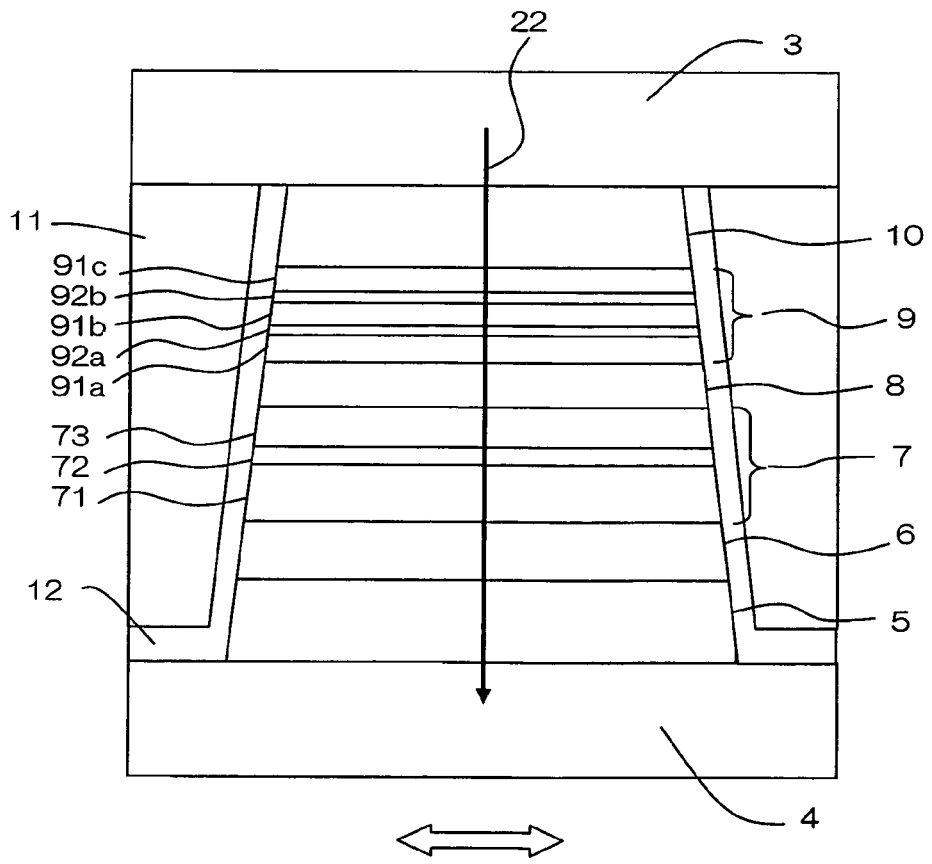
FIG. 2 is a side view of a CPP element viewed from the A-A direction in FIG. 1.

FIG. 2 is a side view of the CPP element, viewed from the A-A direction in FIG. 1, showing the layer structure of the CPP element that appears on the surface of thin-film magnetic head 1 that faces recording medium 21, or faces the ABS (Air Bearing Surface). Table 1 shows an exemplary layer structure of CPP element 2 according to the present embodiment in detail. In the tables in the specification, numerals in the column "Composition" show an atomic percentage, or atomic fraction, of each element. The numerals on the right side of a pair of parentheses show the atomic percentage of the elements, shown in the parentheses, to the entire composition. For instance, (Ni35Fe65)40Co60 in Table 1 means that the atomic percentage of Ni to the atomic percentage of Fe is 35:65, and that the atomic percentage of Ni and Fe to the atomic percentage of Co is 40:60. In other words, (Ni35Fe65)40Co60 is equivalent to Ni14Fe26Co60.

CPP element 2 (SV film) is formed between lower electrode layer 4 and upper electrode layer 3. CPP element 2 is comprised of buffer layer 5, antiferromagnetic layer 6, pinned layer 7, spacer layer 8, free layer 9, and cap layer 10, which are stacked in this order adjacent to each other on lower electrode layer 4 toward upper electrode layer 3. Pinned layer 7 is a lower layer whose magnetization direction is fixed with respect to an external magnetic field, and free layer 9 is an upper layer whose magnetization direction is changed in accordance with the external magnetic field. Spacer layer 8 is sandwiched between pinned layer 7 and free layer 9. When sense current is applied such that it passes through these layers, or in the direction perpendicular to layer surfaces, the relative angle between the magnetization direction of free layer 7 and that of pinned layer 9 varies in accordance with the external magnetic field, causing a change in electric resistance of sense current 22. CPP element 2 detects the magnitude of the external magnetic field by detecting the change in electric resistance, and thereby reads magnetic data in a recording medium. Next, the structure of the essential part of CPP element 2 will be described in detail.

First, lower electrode layer 4, made of perm-alloy (NiFe), is formed on a substrate made of AlTiC ($Al_2O_3$—TiC), not shown, via a seed layer made of alumina ($Al_2O_3$), not shown. Buffer layer 5 is formed on lower electrode layer 4. Buffer layer 5 has a stacked structure consisting of a metal layer made of, for example, Ta, and a seed layer made of, for example, NiFeCr.

Pinned layer 7 is disposed on the seed layer via antiferromagnetic layer 6. Antiferromagnetic layer 6 is provided to fix the magnetization direction of outer pinned layer 71 which will be described later. Antiferromagnetic layer 6 may be made of Mn-based alloy, such as PtMn, RuRhMn, FeMn, NiMn, PdPtMn, RhMn, and CrMnPt, as well as IrMn.

Pinned layer 7, which is a synthetic pinned layer in the present embodiment, has a multilayer structure consisting of outer pinned layer 71, nonmagnetic intermediate layer 72, and inner pinned layer 73 which are stacked in this order. The magnetization direction of inner pinned layer 73 is securely fixed through antiferromagnetic coupling that is caused between inner pinned layer 73 and outer pinned layer 71 via nonmagnetic intermediate layer 72. In a synthetic pinned layer, the magnetic moment of outer pinned layer 71 and that of inner layer 73 are mutually canceled, and leakage of the

TABLE 1

|  | Layer | Composition | Thickness (nm) |
|---|---|---|---|
|  | Cap Layer 10 | Ru | 5.0 |
|  |  | Cu | 3.0 |
| Free Layer 9 | Third Ternary Layer 91c | (Ni35Fe65)40Co60 | 1.7 |
|  | Second Non-magnetic Layer 92b | Cu | 0.2 |
|  | Second Ternary Layer 91b | (Ni35Fe65)40Co60 | 1.7 |
|  | First Non-magnetic Layer 92a | Cu | 0.2 |
|  | First Ternary Layer 91a | (Ni35Fe65)40Co60 | 1.7 |
|  | Spacer Layer 8 | Cu | 3.0 |
| Pinned Layer 7 | Inner Pinned Layer 73 | Co50Fe50 | 2.0 |
|  |  | Cu | 0.2 |
|  |  | Co50Fe50 | 2.0 |
|  | Non-magnetic intermediate Layer 72 | Ru | 0.8 |
|  | Outer Pinned Layer 71 | Co70Fe30 | 4.0 |
|  | Antiferromagnetic Layer 6 | IrMn | 7.0 |
|  | Buffer Layer 5 | NiFeCr | 5.0 |
|  |  | Ta | 1.0 |
|  |  | (Total Thickness) | 38.5 | magnetic field is prevented as a whole. Pinned layer 7 does not need to be a synthetic pinned layer, and may consist of a single layer that does not include a nonmagnetic intermediate layer.

Outer pinned layer 71 and inner pinned layer 73, which are made of CoFe in the present embodiment, may be made of a wide range of ferromagnetic alloy materials, such as CoFeB, Fe, Co, Ni, FeCo, NiFe, and FeCoNi. Nonmagnetic intermediate layer 72 is made of, for example, Ru.

In a synthetic pinned layer, it is inner pinned layer 73 that contributes to the magneto-resistance effect, and in a CPP-GMR element, it is bulk scattering that mainly contributes to the magneto-resistance effect. Therefore, an increase in the film thickness of inner pinned layer 73 leads to a large change in magnetic resistance in a CPP-GMR element. When the film thickness of inner pinned layer 73 is increased, the film thickness of outer pinned layer 71 needs to be increased as well, because the magnetic moment of outer pinned layer 71 and that of inner pinned layer 73 need to balance each other. A Cu layer is inserted in inner pinned layer 73, which contributes to the magneto-resistance effect, in order to cause the boundary scattering effect between the CoFe layer and the Cu layer, and thereby to increase the magneto-resistance ratio.

Spacer layer 8 is made of Cu, and has a film thickness of about 3 nm.

Free layer 9 is comprised of first and second nonmagnetic layers 92a, 92b, each of which contains Cu as the main component, and first, second, and third ternary alloy layers 91a, 91b, 91c each made of cobalt, iron, and nickel. First, second, and third ternary alloy layers 91a, 91b, 91c are disposed on both sides of first and second nonmagnetic layers 92a, 92b. In each of ternary alloy layers 91a, 91b, 91c, ratio x, which is an atomic percentage of nickel to the total atomic percentage of nickel and iron, is preferably in a range of $27\% \leq x \leq 45\%$, and is more preferably about 35%. Ratio y, which is an atomic percentage of cobalt to the total atomic percentage of nickel, iron, and cobalt, is preferably in a range of $42\% \leq y \leq 76\%$, and is more preferably in a range of $52\% \leq y \leq 65\%$. Film thickness t of ternary alloy layers 91a, 91b, 91c is preferably in a range of $1.3\ nm \leq t \leq 2.3\ nm$, and is more preferably in a range of $1.6\ nm \leq t \leq 2.3\ nm$. Ratios x, y and film thickness t may be the same for ternary alloy layers 91a, 91b, 91c, or may be different from each other within these ranges. The basis for the preferable range mentioned above will be described later.

Free layer 9 may also be comprised of one nonmagnetic layer and two ternary alloy layers that are disposed on both sides of the nonmagnetic layer. In this arrangement, film thickness t of each ternary alloy layer is preferably in a range of $1.3\ nm \leq t \leq 3.5\ nm$. Alternatively, free layer 9 may be comprised of three or more nonmagnetic layers and the ternary alloy layers that are disposed on both sides of the corresponding nonmagnetic layers.

Free layer 9, which has a ternary alloy layer that includes cobalt, iron, and nickel as described above, may further contain additives, such as boron, in a very small amount.

Cap layer 10, which is provided to prevent deterioration of CPP element 2, has a multilayer structure which consists of a Cu layer and a Ru layer that are stacked in this order. The Cu layer and the Ru layer are electrically conductive to allow electric current that is applied from upper electrode layer 3 to pass therethrough. Cap layer 10 may be made of Ta, Rh, Pd, Ag, Ir, Pt, or Au, or alloys thereof, in addition to Cu and Ru.

A pair of bias layers 11 is provided on both sides of CPP element 2 with regard to the track width direction which is shown by the white arrow in FIG. 2. Bias layers 11 apply a bias magnetic field to free layer 9 in the track width direction in order to control the magnetic domains of free layer 9. The magnetization direction of free layer 9 is directed in the track width direction by virtue of the bias magnetic field when no external magnetic field is applied from a recording medium. Bias layers 11 may be formed in a single layer that is made of a hard magnetic material, such as CoCrPt or CoPt. Bias layers 11 may also consist of a multilayer structure which has a soft magnetic layer and an antiferromagnetic layer that are stacked in this order. Insulating layers 12 that are made of $Al_2O_3$ are provided between bias layers 11 and CPP element 2 in order to prevent sense current 22 from bypassing bias CPP element 2. The track width, which depends on the width of CPP element 2, will be about 0.1 μm or less.

A write head portion, which is omitted in the figure, is further provided above CPP element 2. The write head portion is covered with an overcoat layer made of alumina or the like.

EXAMPLE

Next, exemplary results of studies which were carried out in order to find proper layer structures of the above described CPP element will be presented. First, the element that was used for evaluation will be explained together with evaluation items.

Figure 3:
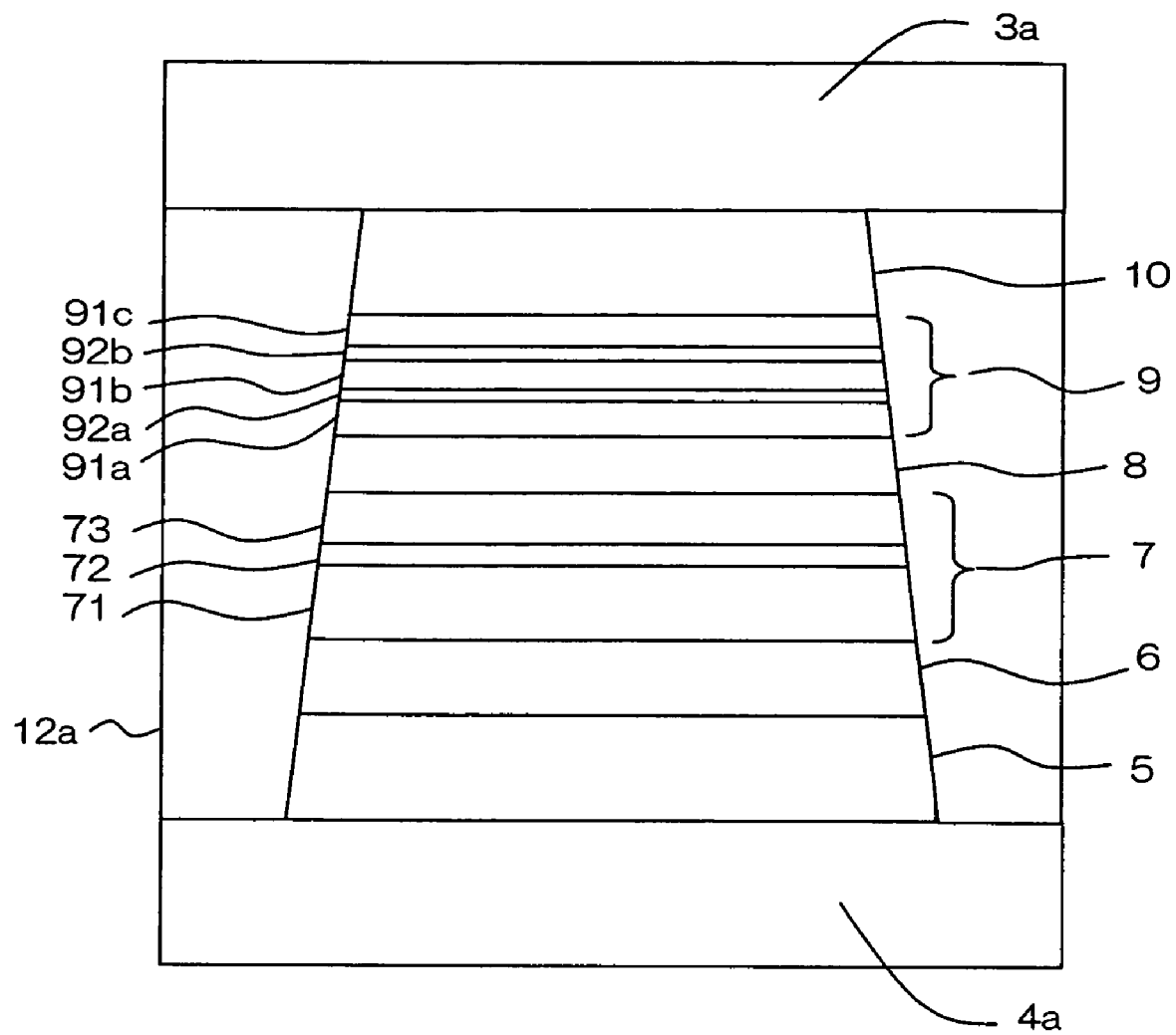
FIG. 3 is a schematic cross-sectional view of an element used for measuring the magneto-resistance ratio.
Figure 4:
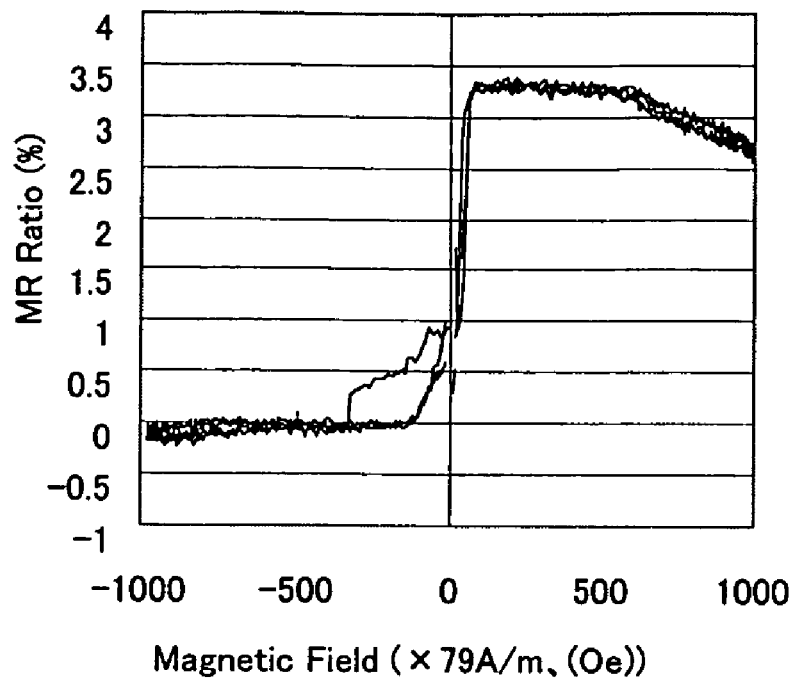
FIG. 4 is an exemplary MR curve that was measured.

FIG. 3 schematically shows a cross section of an element that was used for measuring the magneto-resistance ratio. Lower electrode 4a was made of NiFe alloy so that the SV film used for the experiment was formed on the same layer as in an actual element. A Cu layer was used for upper electrode 3a. An SV film was patterned into a pillar shape having a diameter of 0.2 μm by means of milling, and the sides of the SV film were filled with insulating film 12a made of $Al_2O_3$. FIG. 4 shows an exemplary MR curve that was measured. The vertical axis shows the magneto-resistance ratio that is defined as dR/R, where R represents the resistance of the pillar when a magnetic field of about ±75 kA/m (±1 kOe) was applied, and dR represents the change in the resistance. In general, the value referred to as the magneto-resistance ratio is the maximum value of dR/R.

Figure 5:
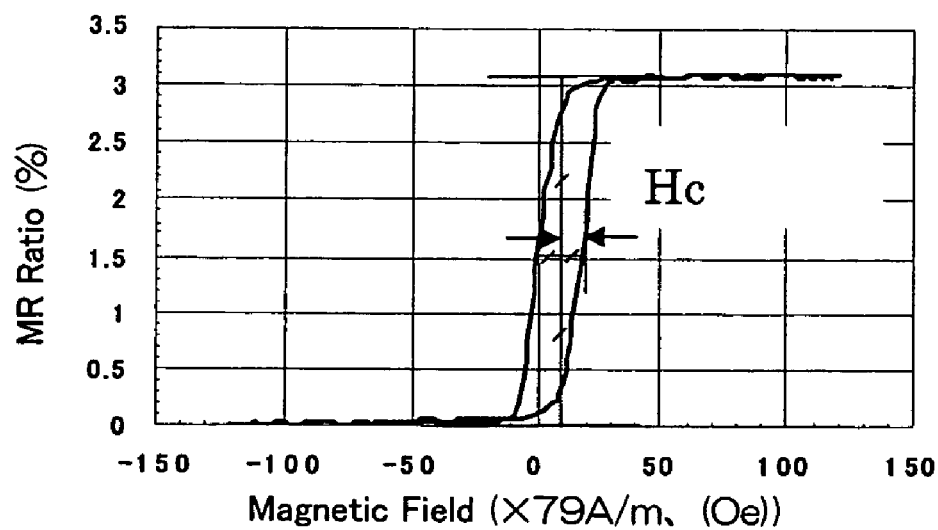
FIG. 5 is an exemplary MR curve that was measured when electric current was applied in the in-plane direction of a CPP-GMR element.

A non-patterned SV film that was formed on a silicon oxide substrate was used to evaluate coercive force and magnetostriction. FIG. 5 shows an exemplary MR curve that was measured when an electric current was applied in the in-plane direction of a CPP-GMR film. In the figure, the magneto-resistance ratio shown by the vertical axis is merely a reference value. The coercive force used in the present specification is the value in the minor loop of the MR curve. The coercive force was calculated based on the result of VSM (Vibration Sample Magnetometer) because the method is thought to give a more precise result, although the coercive force may be estimated from the MR curve as well.

A comparative example is shown in Table 2 together with the layer structures of the present study. A reference example in the right column shows a general layer structure of a CPP-GMR element. The comparative example in the left column shows a layer structure in which a Cu layer was inserted in the free layer of the reference example and in which CoFe layers, which exhibit a large scattering effect at boundaries between themselves and the Cu layers, were inserted on both sides of the Cu layer. Magneto-resistance ratio is largely improved by inserting the Cu layer in the free layer. In the following description, a comparative example will be appropriately used as a base case. Table 2 also shows a summary of the result each study.

TABLE 2

| Layer | Comparative Example Composition | Thickness (nm) | Study 1-1 Table 3 | Study 1-2 Table 4 | Study 2-1 Table 5 |
|---|---|---|---|---|---|
| Cap Layer | Ru | 5.0 | ← | ← | ← |
|  | Cu | 3.0 | ← | ← | ← |
| Free Layer | Co70Fe30 | 1.0 Total | Co70Fe30 | Co90Fe10 | NiFe |
|  | Ni81Fe19 | 2.0 Thickness | NiFe | NiFe |  |
|  | Co70Fe30 | 0.5 7.2 nm | Co70Fe30 | Co90Fe10 |  |
|  | Cu | 0.2 | ← | ← |  |
|  | Co70Fe30 | 0.5 | Co70Fe30 | Co90Fe10 | NiFe |
|  | Ni81Fe19 | 2.0 | NiFe | NiFe |  |
|  | Co70Fe30 | 1.0 | Co70Fe30 | Co90Fe10 |  |
| Spacer Layer | Cu | 3.0 | ← | ← | ← |
| Inner Pinned Layer | Co50Fe50 | 2.0 | ← | ← | ← |
|  | Cu | 0.2 | ← | ← | ← |
|  | Co50Fe50 | 2.0 | ← | ← | ← |
| Non-magnetic interm | Ru | 0.8 | ← | ← | ← |
| Outer Pinned Layer | Co70Fe30 | 4.0 | ← | ← | ← |
| Antiferromagnetic La | IrMn | 7.0 | ← | ← | ← |
| Buffer Layer | NiFeCr | 5.0 | ← | ← | ← |
|  | Ta | 1.0 | ← | ← | ← |
| Parameter |  |  | NiFe Composition | NiFe Composition | NiFe Composition |
| MR Ratio (%) | 3.1 |  |  |  |  |
|  | Total Thickness | 40.2 |  |  |  |

| Layer | Study 2-2 Table 6 | Study 3 Table 7 | Study 4 Table 8 | Study 5 Table 9 | Reference |
|---|---|---|---|---|---|
| Cap Layer | ← | ← | ← | ← | ← |
|  | ← | ← | ← | ← | ← |
| Free Layer | Ni35Fe65 | NiFeCo | (Ni35Fe65)40Co60 | Cu More Than One Layers | 1.0 Ni81Fe19 Thickness 5.0 nm 1.0 |
|  | ← | ← | ← |  |  |
|  | Ni35Fe65 | NiFeCo | (Ni35Fe65)40Co60 |  |  |
| Spacer Layer | ← | ← | ← | ← | ← |
| Inner Pinned Layer | ← | ← | ← | ← | ← |
|  | ← | ← | ← | ← | ← |
|  | ← | ← | ← | ← | ← |
| Non-magnetic interm | ← | ← | ← | ← | ← |
| Outer Pinned Layer | ← | ← | ← | ← | ← |
| Antiferromagnetic La | ← | ← | ← | ← | ← |
| Buffer Layer | ← | ← | ← | ← | ← |
|  | ← | ← | ← | ← | ← |
| Parameter | NiFe Composition | Atomoc Percent of Co | Thickness of NiFeCo Layer | Number of Cu |  |
| MR Ratio (%) |  |  |  |  | 2.1 |

(Study 1-1)

Figure 6:
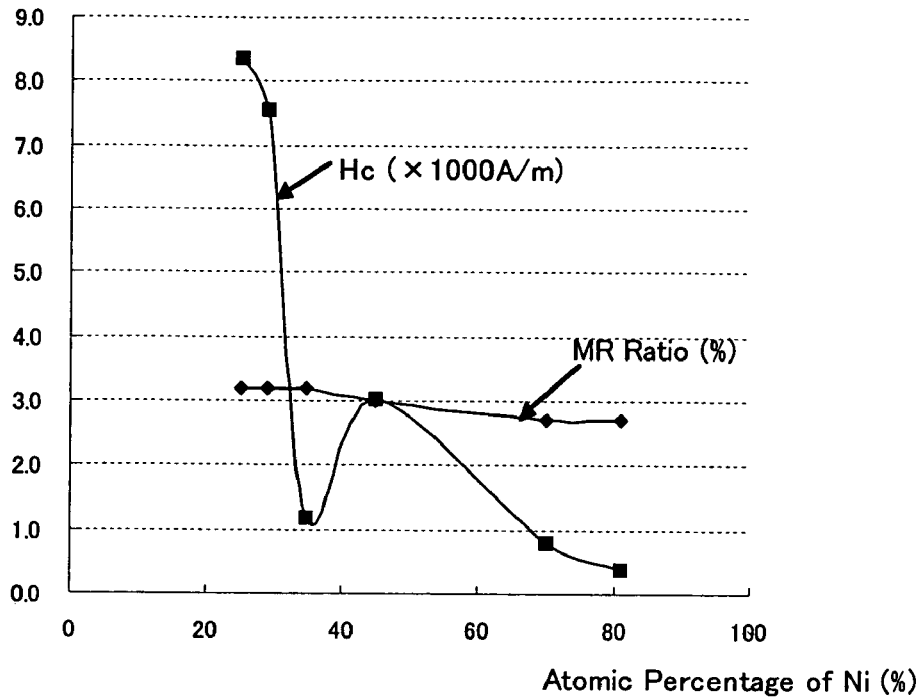
FIG. 6 is a graph showing the influence of the composition of a NiFe layer in a free layer on the magneto-resistance ratio etc.

First, in order to further increase the magneto-resistance ratio, only the composition of the NiFe layer in the comparative example was changed and the influence on the magneto-resistance ratio was studied. This is because the inventors thought that a NiFe layer having a Fe-rich composition would exhibit a large magneto-resistance ratio because the magnetic moment, as well as the bulk scattering coefficient, would be increased. Results are shown in Table 3 and FIG. 6. In the table and the figure, "MR Ratio" means the magneto-resistance ratio. The magneto-resistance ratio is increased when the atomic percentage of Fe is increased (when the atomic percentage of Ni is decreased). On the other hand, coercive force Hc, which represents the soft magnetic properties, tends to be increased when the atomic percentage of Fe is increased. However, it was confirmed that coercive force Hc is reduced when the atomic percentage of Ni is about 35%.

TABLE 3

| Composition | MR Ratio (%) | Hc (× 1000 A/m) |
|---|---|---|
| Ni81Fe19 | 2.7 | 0.4 |
| Ni70Fe30 | 2.7 | 0.8 |
| Ni45Fe55 | 3.0 | 3.0 |
| Ni35Fe65 | 3.2 | 1.2 |
| Ni29Fe71 | 3.2 | 7.6 |
| Ni25Fe75 | 3.2 | 8.4 |

(Study 1-2)

Figure 7:
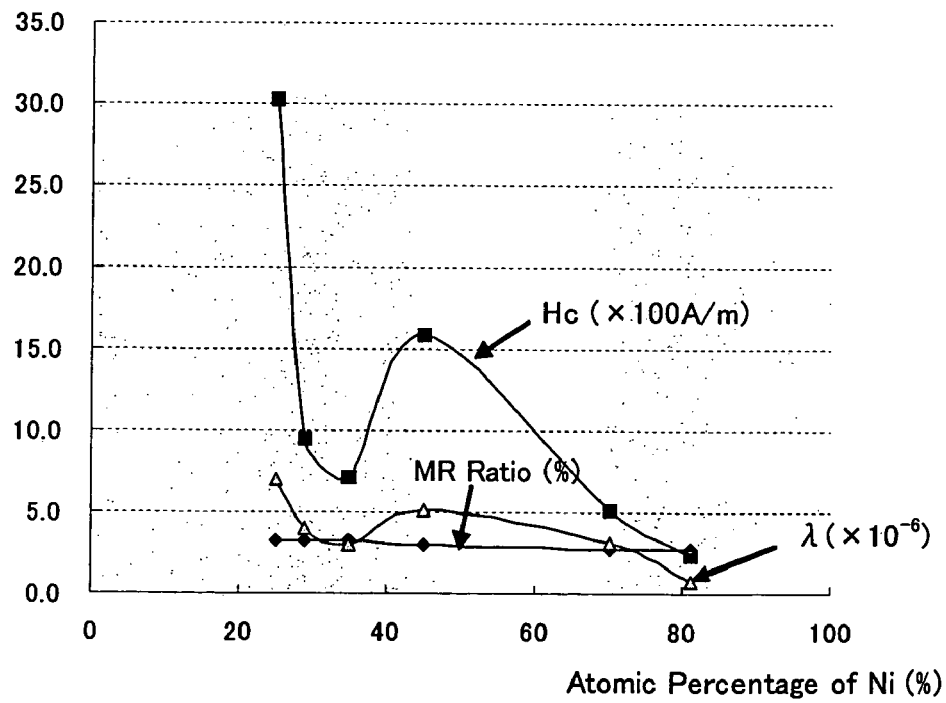
FIG. 7 is a graph showing the influence of the composition of a NiFe layer in a free layer having Co90Fe10 layers on the magneto-resistance ratio etc.

If the free layer has a NiFe layer with a Fe-rich composition, then the soft magnetic properties will greatly depend on the seed layer. For this reason, a similar study was carried out on samples having Co90Fe10, which has the fcc structure (face-centered-cubic crystal structure), for the free layer in place of Co70Fe30, which has the bcc structure (body-centered cubic structure). The results are shown in Table 4 and FIG. 7. Similar to Study 1-1, the magneto-resistance ratio is increased when the atomic percentage of Fe is increased. It was also confirmed that coercive force Hc was reduced when the atomic percentage of Ni is about 35%, as in Study 1-1. Furthermore, it was confirmed that the magneto-striction λ, which greatly affects the soft magnetic properties, was kept comparatively low in this range of the atomic percentage of Ni. The results show that achieving good soft magnetic properties together with a large magneto-resistance ratio is probable by appropriately making use of a particular composition range having a low atomic percentage of Ni.

TABLE 4

| Composition | MR Ratio (%) | Hc (× 100 A/m) | λ (× $10^{-6}$) |
|---|---|---|---|
| Ni81Fe19 | 2.7 | 2.4 | 0.8 |
| Ni70Fe30 | 2.7 | 5.2 | 3.1 |
| Ni45Fe55 | 3.0 | 15.9 | 5.1 |
| Ni35Fe65 | 3.2 | 7.2 | 3.0 |
| Ni29Fe71 | 3.2 | 9.5 | 4.0 |
| Ni25Fe75 | 3.2 | 30.2 | 7.0 |

(Study 2-1)

Figure 8:
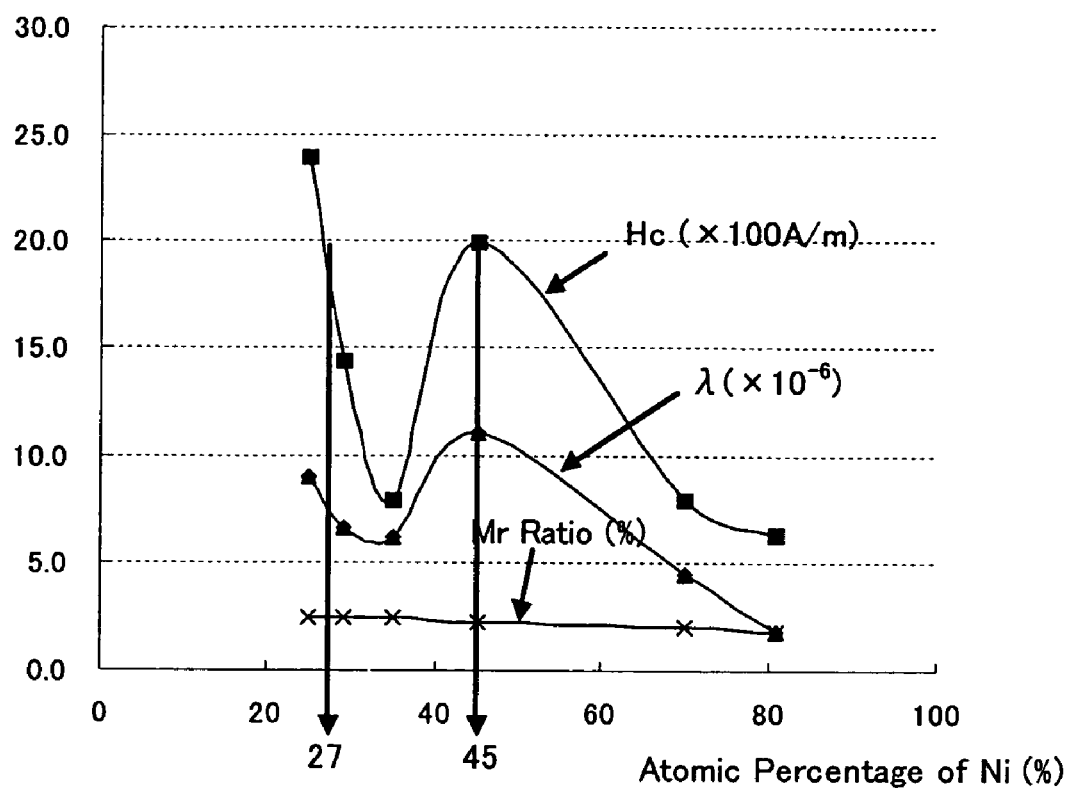
FIG. 8 is a graph showing the influence of a Fe-rich NiFe layer, which is provided in place of a multilayer consisting of CoFe/NiFe/CoFe in a free layer, on a magneto-resistance ratio etc.

Next, the CoFe/NiFe/CoFe layer in the free layer that is shown in the comparative example in Table 2 was replaced with a NiFe layer, and the magneto-resistance ratio was measured using the composition of the NiFe layer as a parameter. In the present specification, the expression a/b/c means that layers a to c are stacked in this order. This study was performed based on the following assumption. Specifically, a conventional free layer has a NiFe layer that contributes to the soft magnetic properties and a CoFe layer that is inserted in the NiFe layer in order to increase the magneto-resistance ratio. As a result, the film thickness in the free layer is large. However, as shown in Studies 1-1 and 1-2, the magneto-resistance ratio tends to be increased with a decrease in atomic percentage x of nickel. Accordingly, even if the CoFe/NiFe/CoFe layer was replaced with a NiFe layer, it was expected that the SV film would exhibit good magnetic characteristics, as long as appropriate atomic percentages of Ni are selected. This is the reason for the present study. The film thickness of two NiFe layers that sandwich a Cu layer was set to be 2.5 nm. The results are shown in Table 5 and FIG. 8. Magneto-striction λ, which actually has a negative value, is shown by an absolute value in FIG. 8. In the Table and the figure, "MR ratio" means the magneto-resistance ratio.

TABLE 5

| Composition | MR Ratio (%) | Hc (× 100 A/m) | λ (× $10^{-6}$) |
|---|---|---|---|
| Ni81Fe19 | 1.8 | 6.4 | −1.8 |
| Ni70Fe30 | 2.0 | 8.0 | −4.5 |
| Ni45Fe55 | 2.3 | 19.9 | −11.0 |
| Ni35Fe65 | 2.5 | 8.0 | −6.2 |
| Ni29Fe71 | 2.5 | 14.3 | −6.6 |
| Ni25Fe75 | 2.5 | 23.9 | −9.0 |

From the table and the figure, it was confirmed that the magneto-resistance ratio is increased when the atomic percentage of Fe is increased (when the atomic percentage of Ni is decreased) and with a resultant increase in the magnetic moment. However, when the atomic percentage of Fe exceeds 65% (atomic percentage of Ni is less than 35%), the magneto-resistance ratio becomes constant. On the other hand, it was confirmed that coercive force Hc, which represents the soft magnetic properties, becomes small when the atomic percentage of Ni is between about 27% and about 45%. Furthermore, it was confirmed that magneto-striction λ, which largely affects the soft magnetic properties, was also kept comparatively low in this region. Based on the results of these study, it was concluded that is was possible for a free layer having a basic layer structure of NiFe/Cu/NiFe to exhibit good soft magnetic properties together with a large magneto-resistance ratio by appropriately making use of a particular composition range having a low atomic percentage of Ni. This is the basis on which the preferable ratio x of the atomic percentage of nickel was 27%≦x≦45%, as described above. In the following studies, ratio x was set to be 35% at which particularly good soft magnetic properties is exhibited.

(Study 2-2)

In order to further study the influence of the film thickness of the NiFe layer, a similar experiment was carried out for the composition of Ni35Fe65, using the film thickness of the NiFe layer as a parameter. The results are shown in Table 6. Although it is thought that the bulk scattering effect of the NiFe layer is increased along with an increase in the magnetic moment, the samples showed lower magneto-resistance ratios than those in Studies 1-1 and 1-2 because of the insufficient scattering effect at the boundaries between the NiFe layer and the Cu layer. Although magneto-striction λ is improved a little by decreasing the film thickness, the absolute value was comparatively large. Accordingly, further improvement in soft magnetic properties is desired.

TABLE 6

| Free Layer | Ni35Fe65 | 2.5 | 3.0 | 3.5 |
|---|---|---|---|---|
| (Thickness(nm)) | Cu | 0.2 | 0.2 | 0.2 |
|  | Ni35Fe65 | 2.5 | 3.0 | 3.5 |
| MR Ratio (%) |  | 2.5 | 2.7 | 2.8 |
| Hc (× 100 A/m) |  | 8.0 | 7.2 | 7.2 |
| λ (× $10^{-6}$) |  | −6.2 | −6.6 | −7.5 |

(Study 3)

Based on the above results of the study, Co was added to a NiFe layer in order to enhance the boundary scattering effect and thereby to increase the magneto-resistance ratio while decreasing the absolute value of magneto-striction. A ternary alloy layer having Ni, Fe, and Co was used in place of the NiFe layer in Table 6, and the film thickness of the ternary alloy layer was fixed to 3.5 nm. Coercive force Hc, magneto-striction λ, and the magneto-resistance ratio relative to atomic percentage of Co y are shown in Table 7 and FIGS. 9A, 9B. Magneto-striction λ, which actually has a negative value, is shown by an absolute value in FIGS. 9A, 9B. In the Table and the figure, "MR ratio" means the magneto-resistance ratio.

TABLE 7

| Atomic Percentage of Co y (%) | MR Ratio (%) | Hc (× 100 A/m) | λ (× $10^{-6}$) |
|---|---|---|---|
| 0 | 2.8 | 7.16 | −7.5 |
| 10 | 2.9 | 7.96 | −9 |
| 20 | 3 | 7.72 | −6 |
| 40 | 3.2 | 7.56 | −5 |
| 60 | 3.3 | 3.18 | −2 |
| 90 | 3.1 | 11.94 | −8 |

(Composition: (Ni35Fe65)100-y Co y)

Figure 9A:
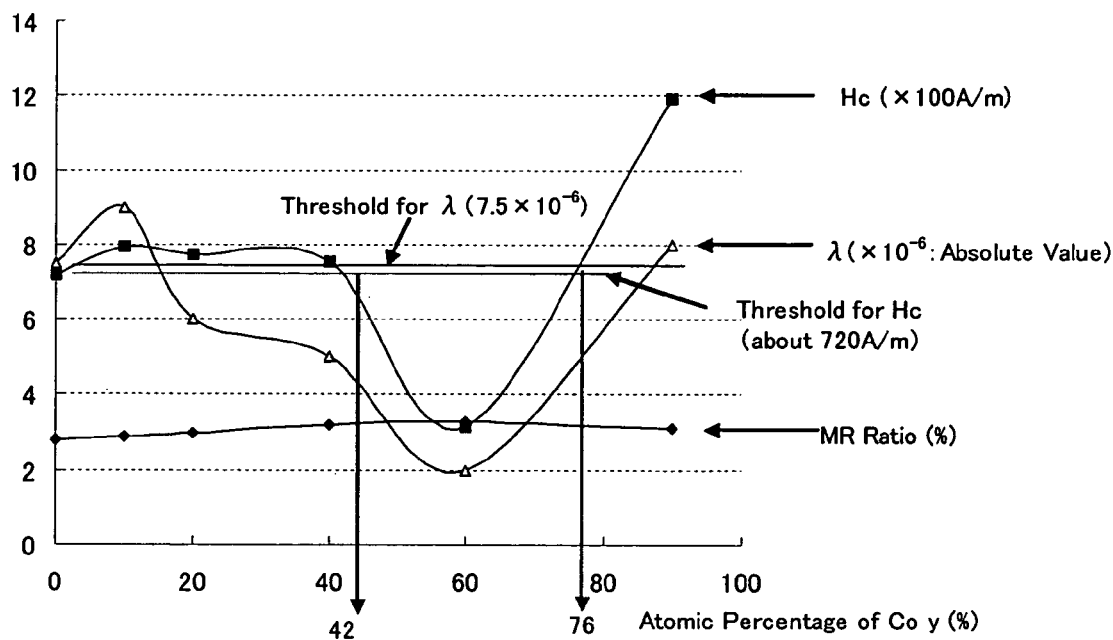
FIGS. 9A, 9B are graphs showing the influence of Co, which is added in an NiFe layer, on the magneto-resistance ratio etc.
Figure 9B:
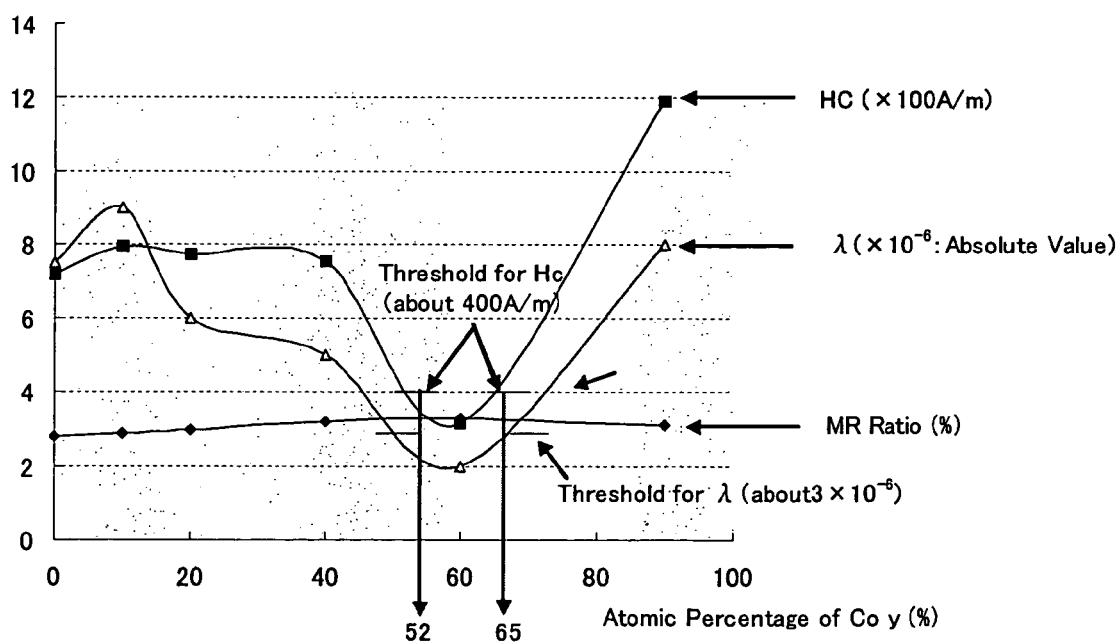

Referring to FIG. 9A, magneto-striction λ is first increased when a small amount of Co, i.e., about 10% of atomic percentage, is added, and then is decreased when a larger amount of Co is added. Coercive force Hc also is decreased when the atomic percentage of Co exceeds a certain value. However, when the atomic percentage of Co is further increased, the magneto-resistance ratio is decreased, and additionally, the magnetic characteristics (Hc and λ) are worsened. For instance, when the atomic percentage of Co is 90%, coercive force Hc is worsened by 60 percent or more as compared with the case in which the atomic percentage of Co is 0%. Both coercive force Hc and magneto-striction λ are improved as compared with the case in which the atomic percentage of Co is 0% when the atomic percentage of Co y is between about 42% and about 76%. The magneto-resistance ratio is also comparatively good in this range. Accordingly, it is preferable that the atomic percentage of Co y is in a range of 42%≦y≦76%. As for the absolute value of magneto-striction λ and coercive force Hc, it is thought that the practical limit of coercive force Hc and magneto-striction λ are about 400 A/m (about 5 Oe) and about $3 \times 10^{-6}$, respectively. Referring to FIG. 9B, these criteria are satisfied in a range between 52% and 65% of the atomic percentage ratio of Co y. Accordingly, it is more preferable that the atomic percentage of Co y is in a range of 52%≦y≦65%, and values around 60% are particularly good.

(Study 4)

As described above, it was confirmed that a ternary alloy layer consisting of Ni, Fe, and Co had both the soft magnetic properties, which is typically provided by a NiFe layer, and the potential for improving the magneto-resistance ratio, which is typically provided by a CoFe layer, and that there was a possibility that the conventional three-layer configuration of CoFe/NiFe/CoFe would be replaced with a ternary alloy layer. Making use of this advantage, the optimal range of the film thickness of the ternary alloy layer was studied in order to achieve a reduction in film thickness, which is another object of the present invention. In the following experiment, the same layer structure as in Study 3 was used, and the atomic percentage of Co y in the ternary alloy layer was fixed to be 60% based on the above results of the study. The results are shown in Table 8 and FIG. 10. Magneto-striction λ, which actually has a negative value, is shown by an absolute value in FIG. 10. In the Table and the figure, "MR ratio" means the magneto-resistance ratio.

TABLE 8

| Thickness of Ternary Alloy Layer (nm) | MR Ratio (%) | Hc (× 100 A/m) | λ (× $10^{-6}$) | Thickness oh Free Layer (nm) |
|---|---|---|---|---|
| 1.0 | 2.2 | 9.5 | −3.5 | 2.2 |
| 1.5 | 2.8 | 5.7 | −2.3 | 3.2 |
| 1.7 | 2.9 | 3.6 | −2.3 | 3.6 |
| 2.0 | 3.1 | 2.4 | −2.0 | 4.2 |
| 3.5 | 3.3 | 3.2 | −1.9 | 7.2 |

Figure 10:
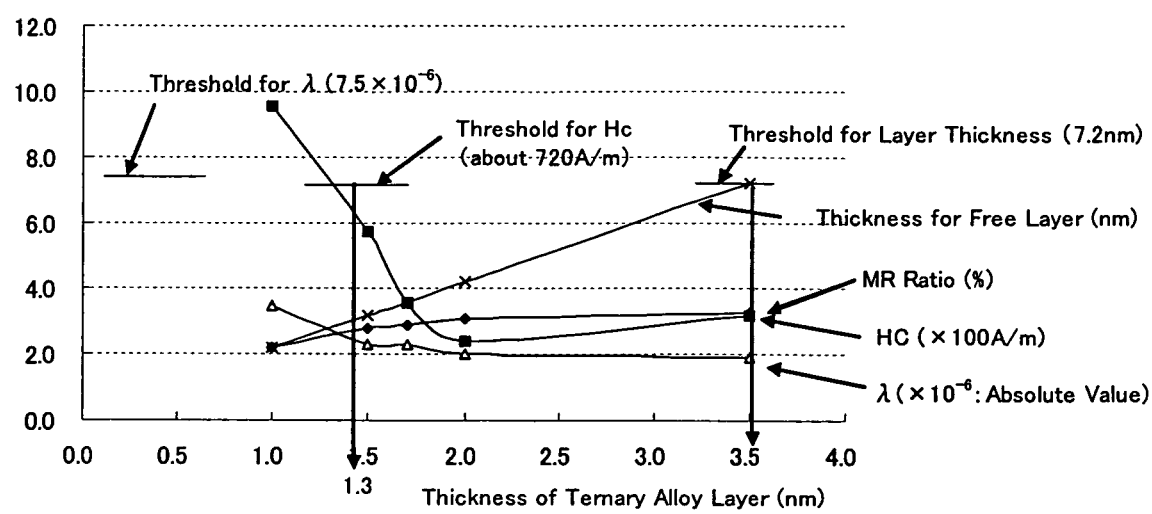
FIG. 10 is a graph showing the influence of the film thickness of a ternary alloy layer on the magneto-resistance ratio etc.

Referring to FIG. 10, since the bulk scattering effect is decreased when the film thickness is decreased, the magneto-resistance ratio also tends to be decreased, though the degree of decrease is small. However, when the film thickness becomes about 1 nm, the magneto-resistance ratio is sharply decreased, and coercive force Hc is also worsened. Both coercive force Hc and magneto-striction λ are improved when film thickness t is about 1.3 nm or larger, if the same threshold values as in Study 3 are used for coercive force Hc and magneto-striction λ. However, as regards a free layer in which the thickness t of the film is large, the magneto-resistance ratio, coercive force Hc, and magneto-striction λ are not greatly improved. Assuming that the upper limit of film thickness t is set to be the film thickness of the comparative example (7.2 nm: see Table 2) in order to reduce the film thickness, it is preferable that film thickness t of free layer 9 is in a range of about 1.3 nm≦t≦3.5 nm (when thickness t is 3.5 nm, the total thickness of the free layer=3.5 nm (the ternary alloy layer)×2+0.2 nm (the Cu nonmagnetic layer)×1=7.2 nm)

(Study 5)

Next, in order to study the influence of the number of nonmagnetic layers that are made of Cu, the magneto-resistance ratio was measured for SV films in which two Cu nonmagnetic layers were inserted in the free layer in the expectation that the magneto-resistance ratio would be increased by virtue of the insertion of Cu layers and by an increase in the number of boundaries. The results are shown in Table 9 and FIGS. 11A, 11B. Magneto-striction λ, which actually has a negative value, is shown by an absolute value in FIGS. 11A, 11B. In the Table and the figure, "MR ratio" means the magneto-resistance ratio.

TABLE 9

| Thickness of Ternary Alloy Layer | MR Ratio (%) | Hc (× 100 A/m) | λ (× $10^{-6}$) | Thickness oh Free Layer (nm) |
|---|---|---|---|---|
| 1.0 | 2.8 | 9.5 | −3.5 | 3.4 |
| 1.5 | 3.3 | 5.7 | −2.3 | 4.9 |
| 1.7 | 3.5 | 3.6 | −2.3 | 5.5 |
| 2.0 | 3.5 | 2.4 | −2.0 | 6.4 |
| 3.5 | 3.4 | 3.2 | −1.9 | 10.9 |

Figure 11A:
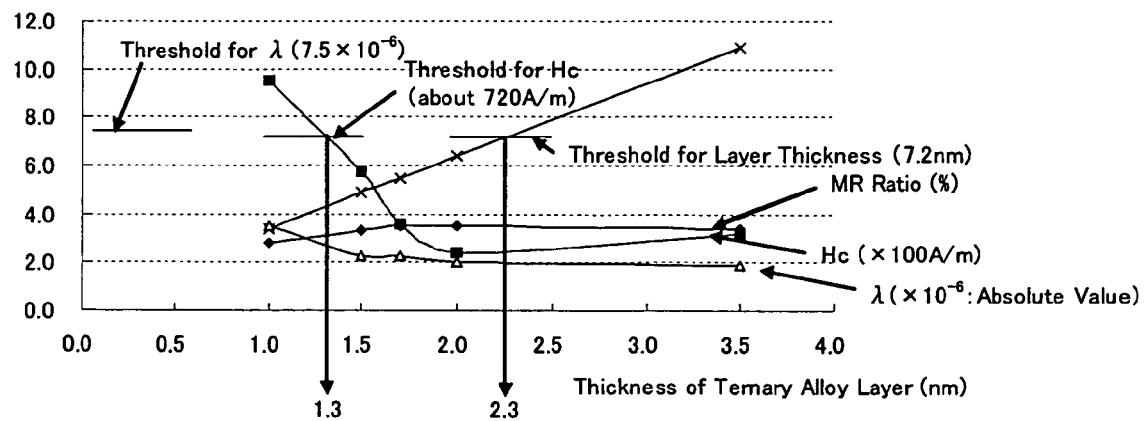
FIGS. 11A, 11B are graphs showing the influence of two Cu nonmagnetic layers, which are inserted in the free layer, on the magneto-resistance ratio etc.

Referring to FIG. 11A, both the magneto-resistance ratio and coercive force Hc are worsened with a decrease in the film thickness. If threshold values for coercive force Hc and for magneto-striction λ are set to be the same as in Study 3, then both coercive force Hc and magneto-striction λ are improved when film thickness t is about 1.3 nm or more. On the other hand, the magneto-resistance ratio, coercive force Hc, and magneto-striction λ are not greatly improved even when film thickness t is increased. Assuming, similar to Study 4, that the upper limit of film thickness t is set to be the film thickness of the comparative example (7.2 nm) in order to reduce the film thickness, it is preferable that film thickness t of free layer 9 is in a range of about 1.3 nm≦t≦2.3 nm (when thickness t is 2.3 nm, the total thickness of the free layer=2.3 nm (the ternary alloy layer)×3+0.2 nm (the Cu nonmagnetic layer)×2=7.3 nm)

Figure 11B:
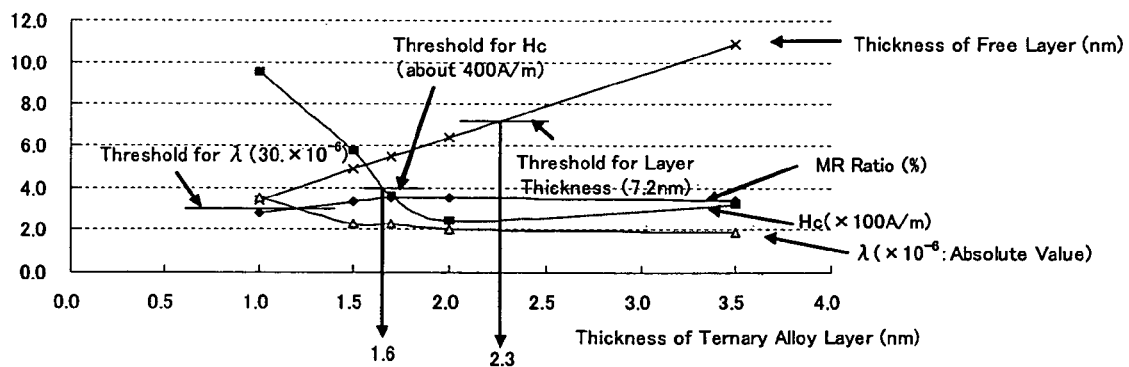

Furthermore, when assuming, similar to Study 4, that a desirable range of coercive force Hc is about 400 A/m (about 5 Oe) or less and that a desirable range of magneto-striction λ is about $3 \times 10^{-6}$ or less, it is preferable that film thickness t is in a range of 1.6 nm≦t≦2.3 nm which satisfies these criteria, as shown in FIG. 11B, and it is particularly preferable that film thickness t is set to be about 2 nm.

(Study 6)

Finally, magnetic heads having the layer structure shown in FIG. 2 were manufactured, and the output power of an isolated read pulse, as well as PW50. The PW50 means a range in which the output power exceeds half the maximum. The layer structure and major properties are shown in Table 10. Referring to the table, Examples 1 and 2 include two nonmagnetic layers made of Cu which are inserted in a ternary alloy layer in the same manner as in Study 5, and have the same layer structure except for the film thickness of the ternary alloy layer. The junction size was set to be 0.1×0.1 μm², the film thickness of $Al_2O_3$ gap layer was set to be 10 nm, and a CoCrPt film (film thickness of 30 nm) was used as a hard magnetic layer. A sense current of 5 mA was applied during measurement. The results are shown in values that are standardized by those in the comparative example.

TABLE 10

| | Example 1 | | Example 2 | | Comparative Example | |
|---|---|---|---|---|---|---|
| | Composition | Thickness (nm) | Composition | Thickness (nm) | Composition | Thickness (nm) |
| Free Layer | | | | | Co70Fe30 | 1 |
| | | | | | Ni81Fe19 | 2 |
| | (Ni35Fe65)40Co60 | 1.5 | (Ni35Fe65)40Co60 | 1.7 | Co70Fe30 | 0.5 |
| | Cu | 0.2 | Cu | 0.2 | Cu | 0.2 |
| | (Ni35Fe65)40Co60 | 1.5 | (Ni35Fe65)40Co60 | 1.7 | Co70Fe30 | 0.5 |
| | Cu | 0.2 | Cu | 0.2 | Ni81Fe19 | 2 |
| | (Ni35Fe65)40Co60 | 1.5 | (Ni35Fe65)40Co60 | 1.7 | Co70Fe30 | 1 |
| Total Thickness of SV Film | 37.9 | | 38.5 | | 40.2 | |
| Output Power of Isolated Read Pulse | 1.08 | | 1.1 | | 1 | |
| PW50 | 0.95 | | 0.97 | | 1 | |

It was confirmed that both Examples exhibited improved values for the output power of an isolated read pulse and the PW50 as compared with those in the comparative example. A small PW50 value means a narrow gap between shield layers. In fact, the total film thickness of the SV film is reduced by about 2 nm from 40.2 nm in the comparative example, as shown in Table 10, and it is thought that a gap was reduced by that value.

The reason why a ternary alloy layer having a particular composition range exhibits good MR characteristics, as well as proper soft magnetic properties, will be summarized as follows. Conventionally, a free layer has a layer structure of CoFe/NiFe/CoFe in order that the NiFe alloy layer will provide the soft magnetic properties and that CoFe alloy layers will provide the scattering effect at the boundary of the Cu layer. However, it is possible to improve the magneto-resistance ratio while minimizing deterioration of the soft magnetic properties and the magneto-striction by using a NiFe film, which has a particular composition in which ratio x of the atomic percentage of nickel is as low as 27%≦x≦45%, in place of a layer structure of CoFe/NiFe/CoFe. The soft magnetic properties are improved by omitting the CoFe layer. Furthermore, the magneto-striction and the magneto-resistance ratio are improved by adding Co to the nickel alloy layer that has a low atomic percentage of nickel. The low atomic percentage of nickel also makes it possible to improve the magneto-resistance ratio even when the film thickness is reduced, because the ratios of Fe and Co are relatively increased by decreasing the ratio of nickel and, as a result, the bulk scattering effect is enhanced. Accordingly, it is possible to reduce the thickness of the SV film while improving the magneto-resistance ratio and the soft magnetic properties.

A magneto-resistive element and a thin-film magnetic head having the same according to the present invention were previously described. However, the magneto-resistive element of the present invention can also be applied to a magnetic memory device and a magnetic sensor assembly. A magnetic memory device of the present invention has a plurality of magneto-resistive elements, described above, and a plurality of lines which are connected to the plurality of magneto-resistive elements. The lines are configured selectively to write information to one of the magneto-resistive elements, and selectively to read information from one of the magneto-resistive elements. A magnetic sensor assembly of the present invention has a substrate which is provided with the magneto-resistive element mentioned above and a lead line which is connected to the magneto-resistive element and which outputs magnetic information of the external magnetic field. The magnetic information is detected by the magneto-resistive element.

Figure 12:
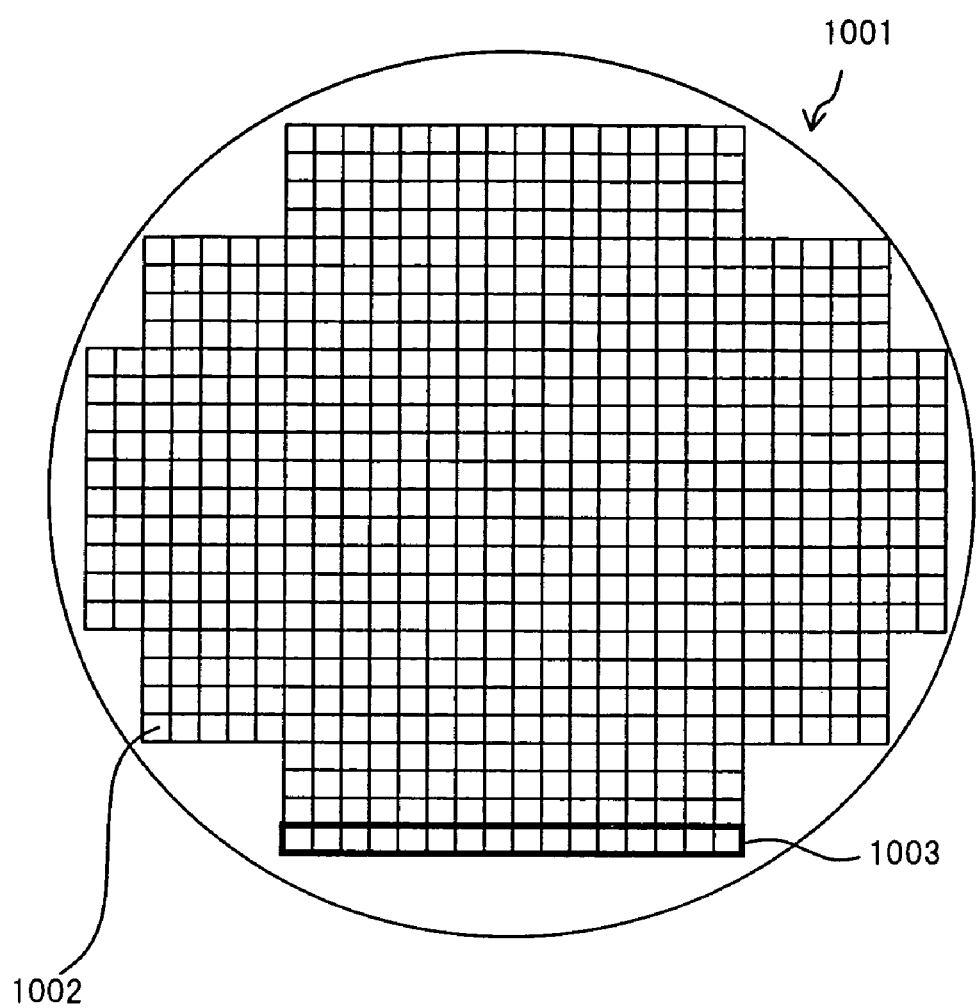
FIG. 12 is a plan view of a wafer that is used to manufacture the magneto-resistive element according to the present invention.

Next, explanation will be made regarding a wafer for fabricating a thin-film magnetic head described above. FIG. 12 is a schematic plan view of a wafer. Wafer 1001 has a plurality of thin-film magneto-electric transducers 1002 which constitutes the thin-film magnetic head and which al least includes an assembly of stacked layers from lower electrode layer 4 to upper electrode layer 3. Wafer 1001 is diced into bars 1003, in which a plurality of thin-film magneto-electric transducers 1002 are formed in a row. Bar 1003 serves as a work unit in the process of forming ABS. Bar 1003 is diced into sliders each having a thin-film magnetic head after lapping. Spaces for dicing, not shown, are provided in wafer 1001 to dice wafer 1001 into bars 1003 and the sliders.

Figure 13:
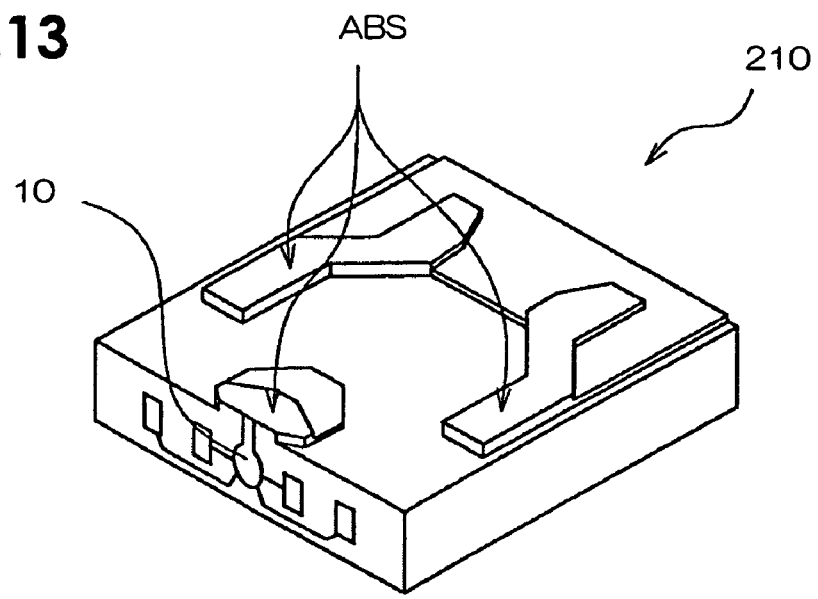
FIG. 13 is a perspective view of a slider that is included in a head gimbal assembly and that incorporates the magneto-resistive element according to the present invention.
Figure 13:
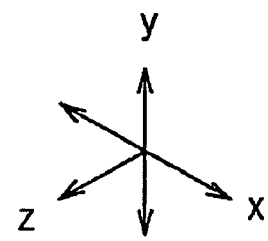

Explanation next regards a head gimbal assembly and a hard disk drive that uses the thin-film magnetic head. Referring to FIG. 13, slider 210 which is included in the head gimbal assembly will be described first. In a hard disk drive, slider 210 is a stacked layer assembly that is arranged opposite to a hard disk, which is a rotationally-driven disciform storage medium. Slider 210 has a substantially hexahedral form. One of the six surfaces of slider 210 forms ABS, which is positioned opposite to the hard disk. When the hard disk rotates in the z direction shown in FIG. 13, an airflow which passes between the hard disk and slider 210 creates a dynamic lift which is applied to slider 210 downward in the y direction of FIG. 13. Slider 210 is configured to lift up from the surface of the hard disk with this dynamic lift effect. In proximity to the trailing edge (the end portion at the lower left in FIG. 13) of slider 210, which is on the outlet side of the airflow, thin-film magnetic head 10 is formed.

Figure 14:
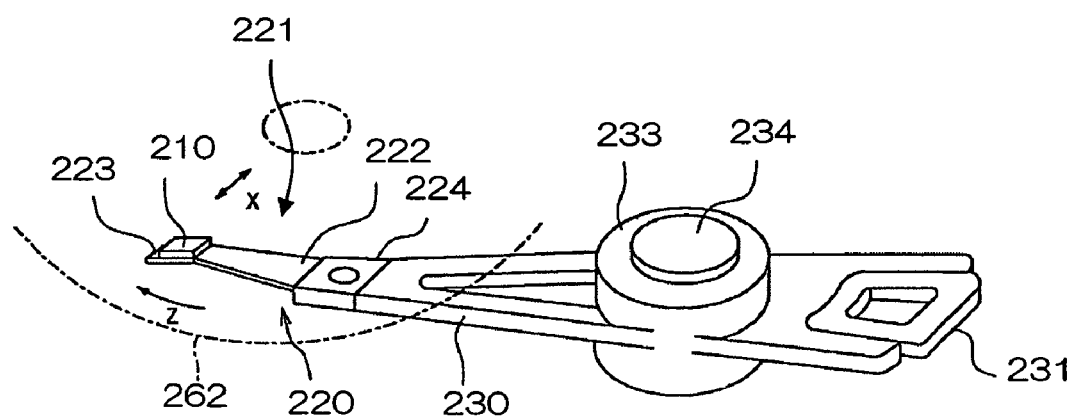
FIG. 14 is a perspective view of a head arm assembly that includes a head gimbal assembly that incorporates the magneto-resistive element according to the present invention.

Referring to FIG. 14, head gimbal assembly 220 that has the thin-film magnetic head will be explained next. Head gimbal assembly 220 is provided with slider 210, and suspension 221 for resiliently supporting slider 210. Suspension 221 has; load beam 222 in the shape of a flat spring and made of, for example, stainless steel; flexure 223 attached to one end of load beam 222, and to which slider 210 is fixed, while providing an appropriate degree of freedom to slider 210; and base plate 224 provided on the other end of load beam 222.

The portion of flexure 223 to which slider 210 is attached has a gimbal section for maintaining slider 210 in a fixed orientation.

The arrangement in which a head gimbal assembly 220 is attached to a single arm 230 is called a head arm assembly. Arm 230 moves slider 210 in the transverse direction x with regard to the track of hard disk 262. One end of arm 230 is attached to base plate 224. Coil 231, which constitutes a part of the voice coil motor, is attached to the other end of arm 230. In the intermediate portion of arm 230, bearing section 233 which has shaft 234 to rotatably hold arm 230 is provided. Arm 230 and the voice coil motor to drive arm 230 constitutes an actuator.

Figure 15:
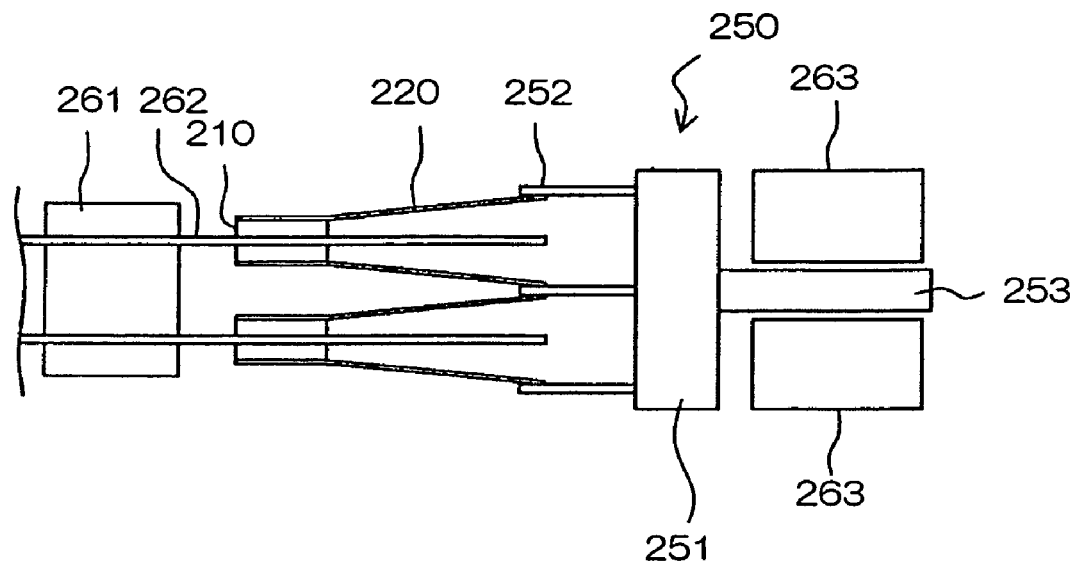
FIG. 15 is a diagram showing essential parts of a hard disk drive that incorporates the magneto-resistive element according to the present invention.
Figure 16:
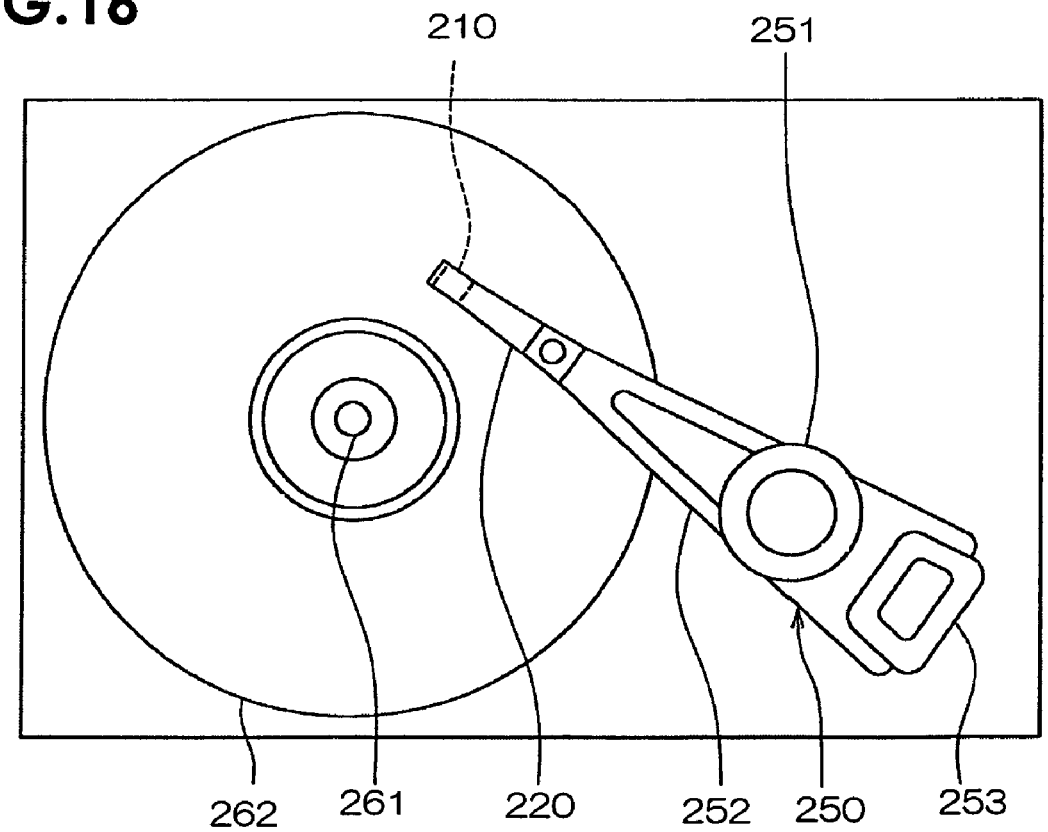
FIG. 16 is a plan view of a hard disk drive that incorporates the magneto-resistive element according to the present invention.

Referring to FIG. 15 and FIG. 16, a head stack assembly and a hard disk drive that use the thin-film magnetic head as a head element will be explained next. The arrangement in which a head gimbal assembly 220 is attached to the respective arm of a carriage having a plurality of arms is called a head stack assembly. FIG. 15 is an explanatory diagram illustrating an essential part of a hard disk drive, and FIG. 16 is a plan view of the hard disk drive. Head stack assembly 250 has carriage 251 provided with a plurality of arms 252. A plurality of head gimbal assemblies 220 are attached to a plurality of arms 252 such that head gimbal assemblies 220 are arranged apart from each other in the vertical direction. Coil 253, which constitutes a part of the voice coil, is attached to carriage 251 on the side opposite to arms 252. The voice coil motor has permanent magnets 263 which are arranged in positions opposite to each other interposing coil 253 of head stack assembly 250 therebetween.

Referring to FIG. 15, head stack assembly 250 is installed in the hard disk drive. The hard disk drive has a plurality of hard disks connected to spindle motor 261. Two sliders 210 are arranged per each hard disk 262 at positions opposite to each other interposing hard disk 262 therebetween. Head stack assembly 250 and the actuator, except for sliders 210, work as a positioning device. They carry sliders 210 and work to position sliders 210 relative to hard disks 262. Sliders 210 are moved by the actuator in the transverse direction with regard to the tracks of hard disks 262, and positioned relative to hard disks 262. Thin-film magnetic head 1 that is contained in slider 210 records information to hard disk 262 with a write head, and reads information recorded in hard disk 262 with a read head.

The present invention was described about a magneto-resistive element of and a thin-film magnetic head using the same. However, the magneto-resistive element of the present invention can also be applied to a magnetic memory device and magnetic sensor assembly. A magnetic memory device of the present invention has a plurality of magneto-resistive elements described above, and a plurality of lines which are connected to the plurality of magneto-resistive elements. The lines are configured selectively to write information to one of the magneto-resistive elements, and selectively to read information from one of the magneto-resistive elements. A magnetic sensor assembly of the present invention has a substrate which is provided with the magneto-resistive element mentioned above and a lead line which is connected to the magneto-resistive element and which outputs magnetic information of the external magnetic field. The magnetic information is detected by the magneto-resistive element. Although a certain preferred embodiment of the present invention has been shown and described in detail, it should be understood that various changes and modifications may be made without departing from the spirit or scope of the appended claims.

What is claimed is:

1. A magneto-resistive element comprising;
a pinned layer whose magnetization direction is fixed with respect to an external magnetic field;
a free layer whose magnetization direction is changed in accordance with the external magnetic field; and
a spacer layer which is sandwiched between said pinned layer and said free layer, said spacer layer being made of copper,
wherein said magneto-resistive element is configured such that sense current is applied in a direction that is perpendicular to layer surfaces,
wherein said free layer comprises:
a nonmagnetic layer that includes copper as a main component, and
ternary alloy layers each including cobalt (Co), iron (Fe), and nickel (Ni), said ternary alloy layers being disposed on both sides of said nonmagnetic layer,
wherein said ternary alloy layer includes nickel and iron at a composition ratio in which a ratio x of an atomic percentage of nickel to a total atomic percentage of nickel and iron is $27\% \leq x \leq 45\%$, and
wherein said free layer consists of one nonmagnetic layer and two ternary alloy layers which are provided on both sides of said nonmagnetic layer, and wherein a thickness t of each ternary alloy layer is in a range of $1.3\ nm \leq t \leq 3.5\ nm$.

2. A thin-film magnetic head having the magneto-resistive element according to claim 1.

3. A wafer that is used to manufacture the thin-film magnetic head according to claim 2, said wafer comprising said magneto-resistive element.

4. A head gimbal assembly comprising: a slider that includes said thin-film magnetic head according to claim 2, said slider being configured to be arranged opposite to a recording medium; and a suspension for elastically supporting said slider.

5. A hard disk device comprising: a slider that includes said thin-film magnetic head according to claim 2, said slider being configured to be arranged opposite to a disc-shaped recording medium that is rotatably driven; and a positioning device for supporting said slider and for positioning said slider relative to said recording medium.

6. A magnetic memory device comprising:
a plurality of magneto-resistive elements according to claim 1; and
a plurality of lines which are connected to said plurality of magneto-resistive elements, said lines being configured selectively to write information to one of said magneto-resistive elements, and selectively to read information from one of said magneto-resistive elements.

7. A magnetic sensor assembly comprising:
a substrate which is provided with the magneto-resistive element according to claim 1; and
a lead line which is connected to said magneto-resistive element and which outputs magnetic information of said external magnetic field, said magnetic information being detected by said magneto-resistive element.

8. A magneto-resistive element comprising;
a pinned layer whose magnetization direction is fixed with respect to an external magnetic field;
a free layer whose magnetization direction is changed in accordance with the external magnetic field; and
a spacer layer which is sandwiched between said pinned layer and said free layer, said spacer layer being made of copper, wherein said magneto-resistive element is configured such that sense current is applied in a direction that is perpendicular to layer surfaces,
wherein said free layer comprises:
a nonmagnetic layer that includes copper as a main component, and
ternary alloy layers each including cobalt (Co), iron (Fe), and nickel (Ni), said ternary alloy layers being disposed on both sides of said nonmagnetic layer,
wherein said ternary alloy layer includes nickel and iron at a composition ratio in which a ratio x of an atomic percentage of nickel to a total atomic percentage of nickel and iron is $27\% \leqq x \leqq 45\%$, and
wherein said free layer consists of two nonmagnetic layers and three ternary alloy layers which are provided on both sides of said nonmagnetic layers, and wherein a thickness t of each ternary alloy layer is in a range of $1.3 \text{ nm} \leqq t \leqq 2.3 \text{ nm}$.

9. The magneto-resistive element according to claim 8, wherein said film thickness t of each ternary alloy layer is in a range of $1.6 \text{ nm} \leqq t \leqq 2.3 \text{ nm}$.

10. A magneto-resistive element comprising:
a pinned layer whose magnetization direction is fixed with respect to an external magnetic field;
a free layer whose magnetization direction is changed in accordance with the external magnetic field; and
a spacer layer which is sandwiched between said pinned layer and said free layer, said spacer layer being made of copper,
wherein said magneto-resistive element is configured such that sense current is applied in a direction that is perpendicular to layer surfaces,
wherein said free layer comprises:
a nonmagnetic layer that includes copper as a main component, and
ternary alloy layers each including cobalt (Co), iron (Fe), and nickel (Ni), said ternary alloy layers being disposed on both sides of said nonmagnetic layer,
wherein said ternary alloy layer includes nickel and iron at a composition ratio in which a ratio x of an atomic percentage of nickel to a total atomic percentage of nickel and iron is $27\% \leqq x \leqq 45\%$, and
wherein said free layer has three or more of said nonmagnetic layers and four or more of said ternary alloy layers which are provided on both sides of said nonmagnetic layers.

* * * * *